(12) United States Patent
Jalan et al.

(10) Patent No.: US 9,361,027 B1
(45) Date of Patent: Jun. 7, 2016

(54) SYSTEM AND METHOD FOR FAST MODIFICATION OF REGISTER CONTENT

(71) Applicant: Texas Instruments Incorporated, Dallas, TX (US)

(72) Inventors: Saket Jalan, Bangalore (IN); Rakesh Channabasappa Yaraduyathinahalli, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/571,898

(22) Filed: Dec. 16, 2014

(51) Int. Cl.
*G06F 12/00* (2006.01)
*G06F 3/06* (2006.01)

(52) U.S. Cl.
CPC .............. *G06F 3/061* (2013.01); *G06F 3/0659* (2013.01); *G06F 3/0673* (2013.01)

(58) Field of Classification Search
CPC ...... G06F 3/061; G06F 3/0659; G06F 3/0673
See application file for complete search history.

(56) References Cited

U.S. PATENT DOCUMENTS 5,481,729 A * 1/1996 Shibuya .................. G06F 13/26
710/220

\* cited by examiner

*Primary Examiner* — Shawn X Gu
(74) *Attorney, Agent, or Firm* — Ronald O. Neerings; Frank D. Cimino

(57) ABSTRACT

The present invention is drawn to a register writing mechanism that does not require reading of the data in the register. In accordance with aspects of the present invention, each register is masked with a making bit provided by a masking component. In a first implementation, the first half of the bit registers are masked using data in the second half of the bit registers. In a second implementation, all the bit registers are masked using a masking word generated by the masking component.

20 Claims, 7 Drawing Sheets

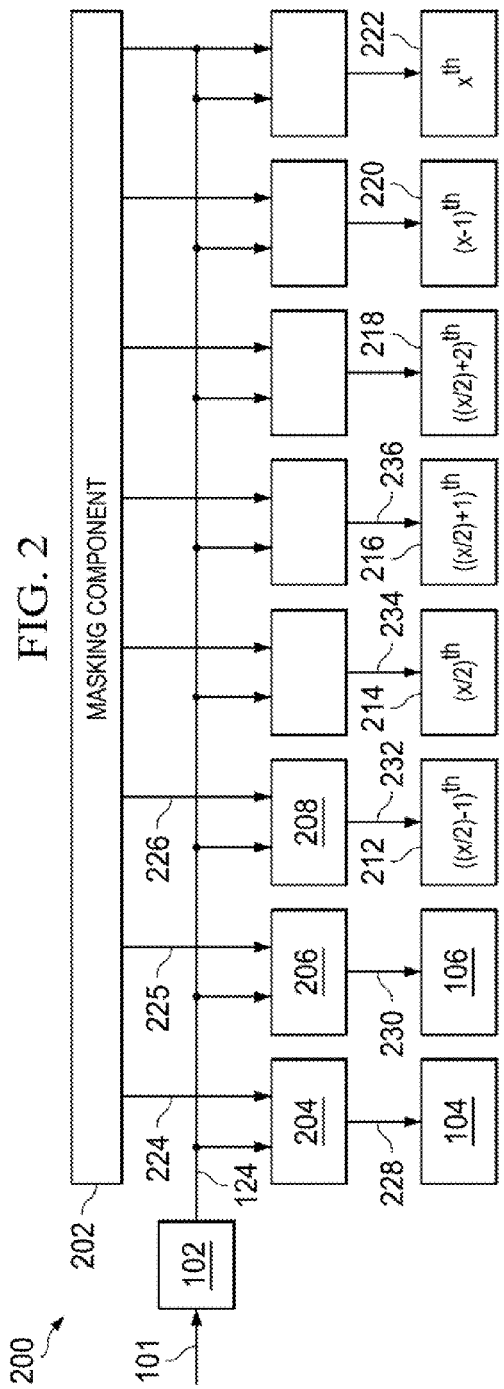
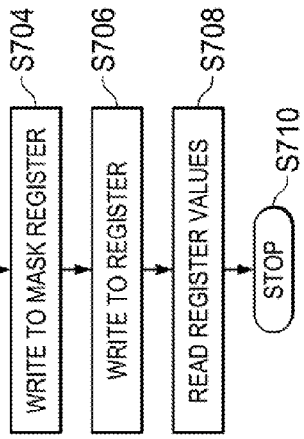
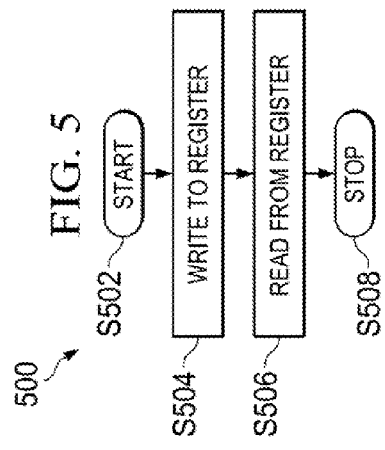

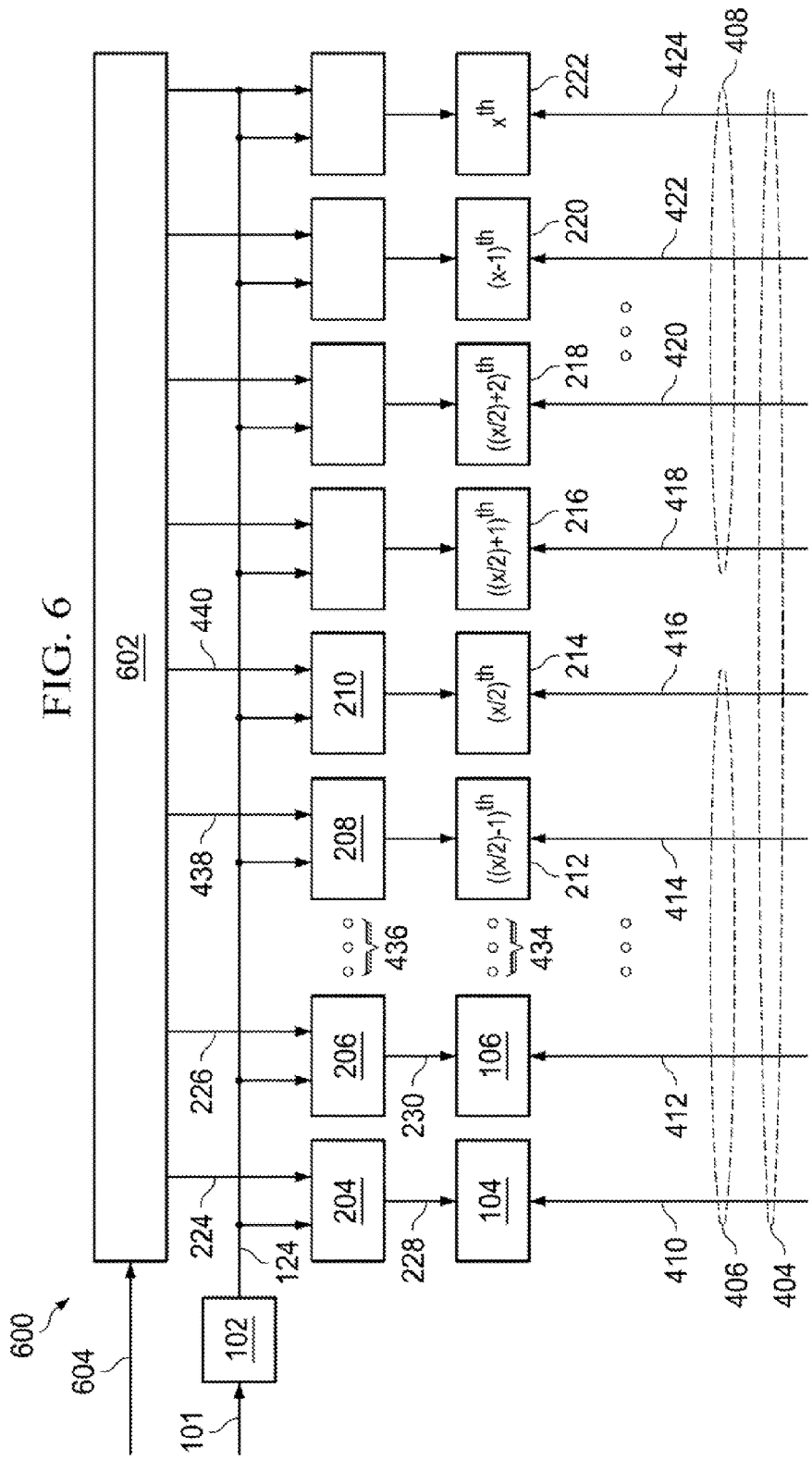

SYSTEM AND METHOD FOR FAST MODIFICATION OF REGISTER CONTENT

BACKGROUND

The present invention is generally drawn to reducing the time (or CPU cycles) needed to write to a register.

In today's market, many of the system on chips (SOC) feature at least one embedded microprocessor. A significant task handled by the microprocessor is the programming of the various registers in the SOC. Most of often, the programming is done through a read-modify-write mechanism by the firmware. This mechanism is inefficient in terms of the CPU cycles needed for each register update. A conventional read-modify-write mechanism will now be described with reference to FIG. 1.

FIG. 1 illustrates a conventional Read-Modify-Write mechanism 100.

As shown, Read-Modify-Write mechanism 100 includes an address decoding logic component 102, a bit register 104, a bit register 106, and a bit register 108. Bit register 104 includes a MUX 110 and a Flip-Flop 112, bit register 106 includes a MUX 114 and Flip-Flop 116, and bit register 108 includes a MUX 118 and a Flip-Flop 120.

Address decoding logic component 102 is arranged to receive an address signal by way of line 101. Address decoding logic component 102 is additionally arranged to output an enable signal to each of the bit registers 104, 106, and 108 by way of line a write line 122.

Bit registers 104, 106, and 108 are arranged to receive a clock signal by way of line 148. Bit registers 104, 106, and 108 are additionally arranged to output one of the stored bits of data by way of a read line 124, 126, and 128 respectively.

MUX 110 is arranged to receive data at an input 136 from a write line 156 and to receive at an input 130 from read line 126. MUX 114 is arranged to receive data at an input 138 from a write line 158 and to receive at an input 132 from read line 126. MUX 118 is arranged to receive data at an input 140 from a write line 160 and to receive data at an input 134 from read line 128.

Finally, Flip-Flop 112, 116, and 120 are arranged to output data via read lines 124, 126, and 128, respectively and to receive data at a clock input 162, 164, and 166 from a clock signal line 148. Each flip-flop also includes a D-input 142, 144, and 146.

The operation of the read-modify-write mechanism 100 begins with a read command. When the mechanism is prompted to do a read, a signal is sent on read lines 124, 126, and 128 into bit registers 104, 106, and 108, respectively. Once the read signal is sent, the data currently contained in bit registers 104, 106, and 108 are forwarded from the output of flip-flops 112, 116, and 120 via read line 124, 126, and 128 to their corresponding MUX. At this point, each MUX 112, 116, and 120 has read-in the data and stores it at their corresponding inputs 130, 132, and 134. This completes the read step.

Next, read-modify-write mechanism 100 starts to modify what is in the registers. In this example, read-modify-write mechanism 100 discloses a set of three 1-bit registers associated with one address, that of address decoding logic component 102. It should be noted that there may be many sets of bit registers, each with an associated address decoding logic component. As such, for purposes of explanation, only the set of registers associated with address decoding logic component 102 are shown.

An address signal is sent via line 101 to address decoding logic component 102. Upon receipt of the address signal, address decoding logic component 102 outputs a value of "1" onto bus line 122. This value passes to each MUX (104, 116, 120), which enables the MUX to write-in the value via write lines 156, 158, and 160 to first inputs 136, 138, and 140, respectively, and then latch the new data to corresponding flip-flops 112, 116 and 120, respectively. As such, the data in each of flip-flops 112, 116 and 120 has now been modified. This completes the modification step.

After the modification step, the last step is to write-out the data from the output of flip-flops 112, 116, 120 via the read lines 124, 126, and 128 respectively.

The problem with the system shown in FIG. 1 is that there is an extra cycle required to first read in the data. This mechanism generally involves reading the entire content of each register, modifying all the bits, and then writing the entire content back to the register. This mechanism consumes a major portion of time.

What is needed is a system and method that does not require a read step, so the amount of time programming various registers can be reduced.

BRIEF SUMMARY

The present invention provides a system and method that can significantly reduce the time (or CPU cycles) needed to write in a register.

In accordance with aspects of the present invention a device is provided that includes an address decoding logic component, x bit registers, x/2 write lines, x/2 read lines, x/2 functional components and a masking component, wherein x is an integer greater than or equal to 2. The address decoding logic component outputs an enable signal based on an address signal. The x bit registers include a first portion and a second portion. Each of the x bit registers can store one of x stored bits of data, respectively. The first portion has $0^{th}$ through $(x/2-1)^{th}$ bit registers, whereas the second portion has $(x/2)^{th}$ through $(x-1)^{th}$ bit registers. Each of the x/2 write lines can provide one of x/2 new bits of data into a corresponding one of the bit registers in the first portion, respectively. Each of the x/2 read lines can output one of the stored bits of data from a corresponding one of the bit registers in the first portion, respectively. Each of the x/2 functional components can provide a modified enable signal to a corresponding one of the bit registers in the first portion, respectively. The masking component can generate x/2 masking signals and can provide one of the x/2 masking signals to a corresponding one the functional components, respectively. Each modified enable signal is based on the enable signal and a corresponding masking signal. Each of the bit registers in the first portion can modify a stored bit therein, respectively, based on the corresponding modified enable signal, respectively.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 2 illustrates a write mechanism in accordance with aspects of the present invention.

FIG. 5 illustrates an example method of writing to a register in accordance with aspects of the present invention;

FIG. 6 illustrates another example embodiment of a write mechanism in accordance with aspects of the present invention; and FIG. 7 illustrates an example method of writing to a register in accordance with aspects of the present invention.

DETAILED DESCRIPTION

Figure 1:
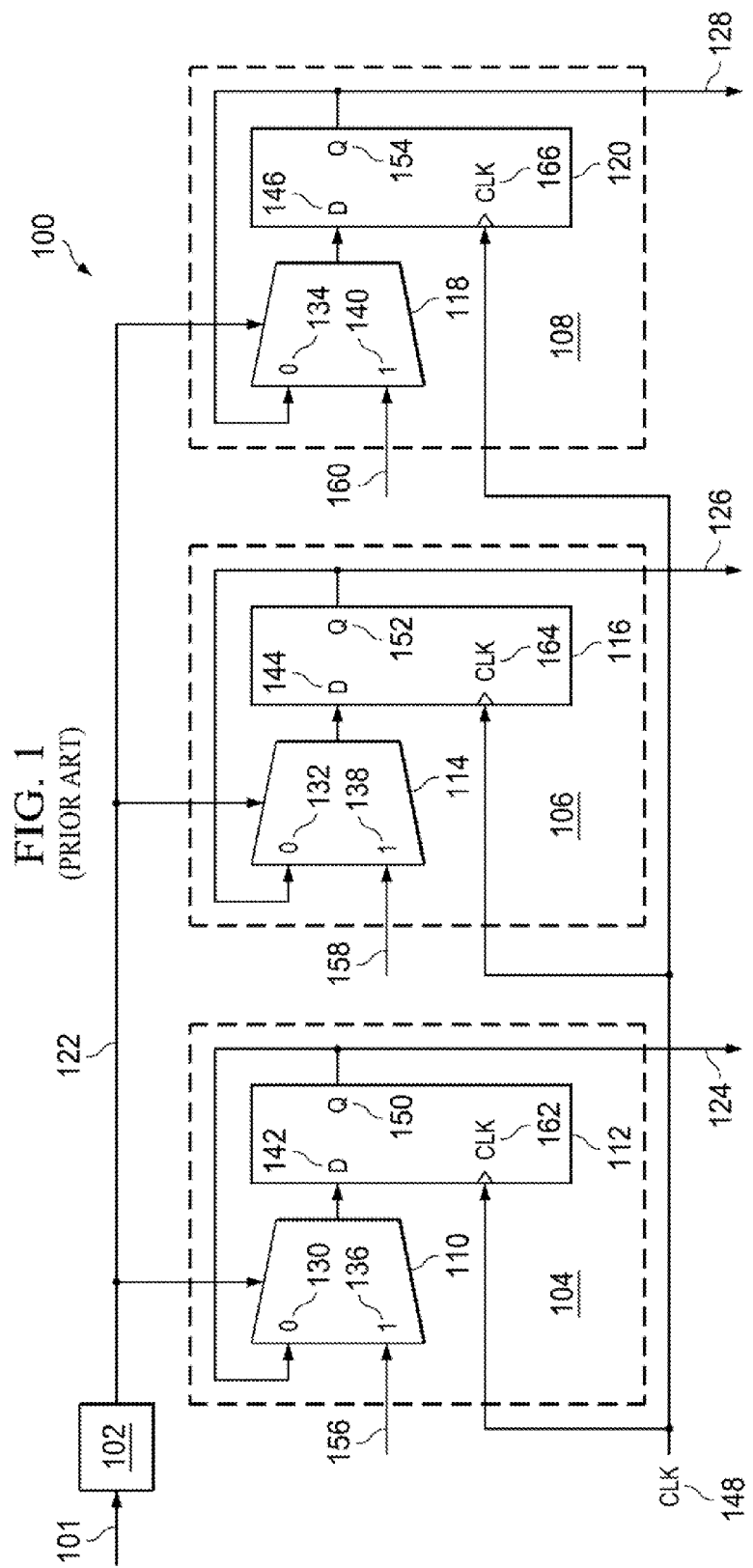
FIG. 1 illustrates a Read-Modify-Write Prior Art Mechanism.

The present invention is drawn to a register writing mechanism that does not require reading of the data in the register. In accordance with aspects of the present invention, each register is masked with a making bit provided by a masking component. In a first implementation, the first half of the bit registers are masked using data in the second half of the bit registers. In a second implementation, all the bit registers are masked using a masking word generated by the masking component.

Aspects of the present invention will now be described with reference to FIGS. 2-7.

An aspect of writing to registers using a masking component in accordance with a first aspect of the present invention will now be described with reference to FIGS. 2-3B.

FIG. 2 illustrates a write mechanism 200 in accordance with a first aspect of the present invention.

As shown in the figure, write mechanism 200 includes address decoding logic component 102, a masking component 202, a plurality of functional components, a sample of which have been numbered as a functional component 204, a functional component 206, and a functional component 208, a plurality of bit registers, a sample of which have been numbered as bit register 104, bit register 106, a bit register 212, a bit register 214, a bit register 216, a bit register 218, a bit register 220, and a bit register 222.

In this embodiment, masking component 202 is operable to generate x masking signals, where x is the number of bits. Each masking signals is provided to one of the plurality of corresponding functional components. In this example, functional component 204, 206, and 208 receive a masking signal by way lines 224, 225, and 226, respectively.

Functional components 204, 206, and 208 are each operable to provide a modified enable signal to bit registers 104, 106, and 212, respectively, by way of lines 228, 230, and 232, respectively.

Write mechanism 200 is illustrated as a generic system that may include x number of functional components and bit registers based on the bit size. For example, for an 8-bit register, x would equal 8, and bit registers 104, 106, 212, 214, 216, 218, 220, and 222 would be active bit registers.

Masking component 202 provides masking signals by way of masking lines, a sample of which are numbered 224, 225, and 226, to a corresponding functional component. Address decoding to logic component 102 additionally provides an enable signal to the functional components.

Functional components 204, 206, 208 may be any device or system that is able to output a modified enable signal based on the enable signal from address decoding logic component 102 and based on the received masking signal. The output of functional components 204, 206, 208 controls the bit registers so as modify or recycle the existing data stored therein. Non-limiting examples of a functional component include a digital logic component such as an OR gate or AND gate.

An example of the embodiment described in FIG. 2 will now be further described with reference to FIG. 3A and FIG. 3B using two registers.

Figure 3A:
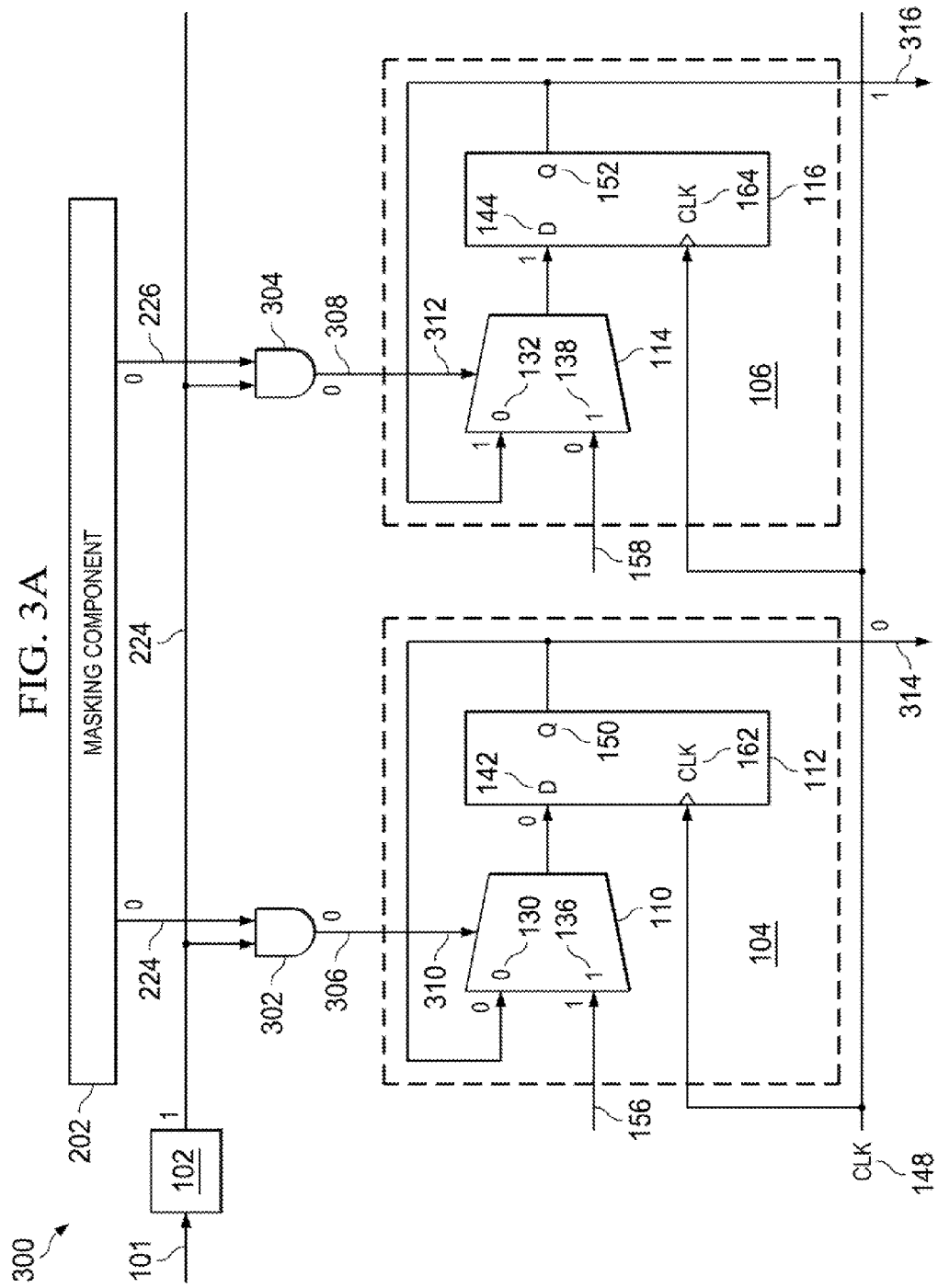
FIG. 3A illustrates the operation of the first two bits of an example of an implementation of system.

FIG. 3A illustrates the operation of the first two bit registers of system 200 in a first state.

As shown, FIG. 3A includes address decoding logic component 102 and for this example, bit register 104 and bit register 106. Additionally, in this embodiment, the functional components are implemented as AND gates. In particular, functional component 204 of FIG. 2 is implemented as an AND gate 302 and functional component 206 of FIG. 2 is implemented as an AND gate 304.

AND gates 302 and 304 are arranged to receive one of the x masking signals and the enable signal, and are operable to output a Boolean AND at outputs 306 and 308 of the received signals to the bit registers 104 and 106 by way of lines 310 and 312.

For purposes of discussion, let the output of the masking component 204 seen on masking lines 224 and 226 be a value of "0". This indicates that the data in register 104 need not be modified. This value is sent along the masking lines to the AND gates 302 and 304. The address signal enters address decoding logic component 102 by way of line 101, such that address decoding logic component 102 outputs a "1". This signal passes along bus line 122 to the AND gates 302 and 304.

AND gates 302 and 304 will have a "0" at outputs 306 and 308, respectively. The value "0" is provided to MUX 136 via line 310 and is provided to MUX 138 via line 312. The value zero indicates to MUX 136 that it is to select input 130 and pass it to D-inputs 142 of flip-flops 112. Similarly, the value zero indicates to MUX 138 that it is to select input 132 and pass it to D-input 144 of flip-flop 116. Since no data was modified, the existing value of bit register 104 is recycled and written out by read line 314 and the existing value of bit register 106 is recycled and written out by read line 316.

As described in FIG. 3A, when masking component 204 outputs a "0", bit registers 104 and 106 read out their currently stored value. The results of masking component 204 outputting a "1" will now be described with reference to FIG. 3B.

Figure 3B:
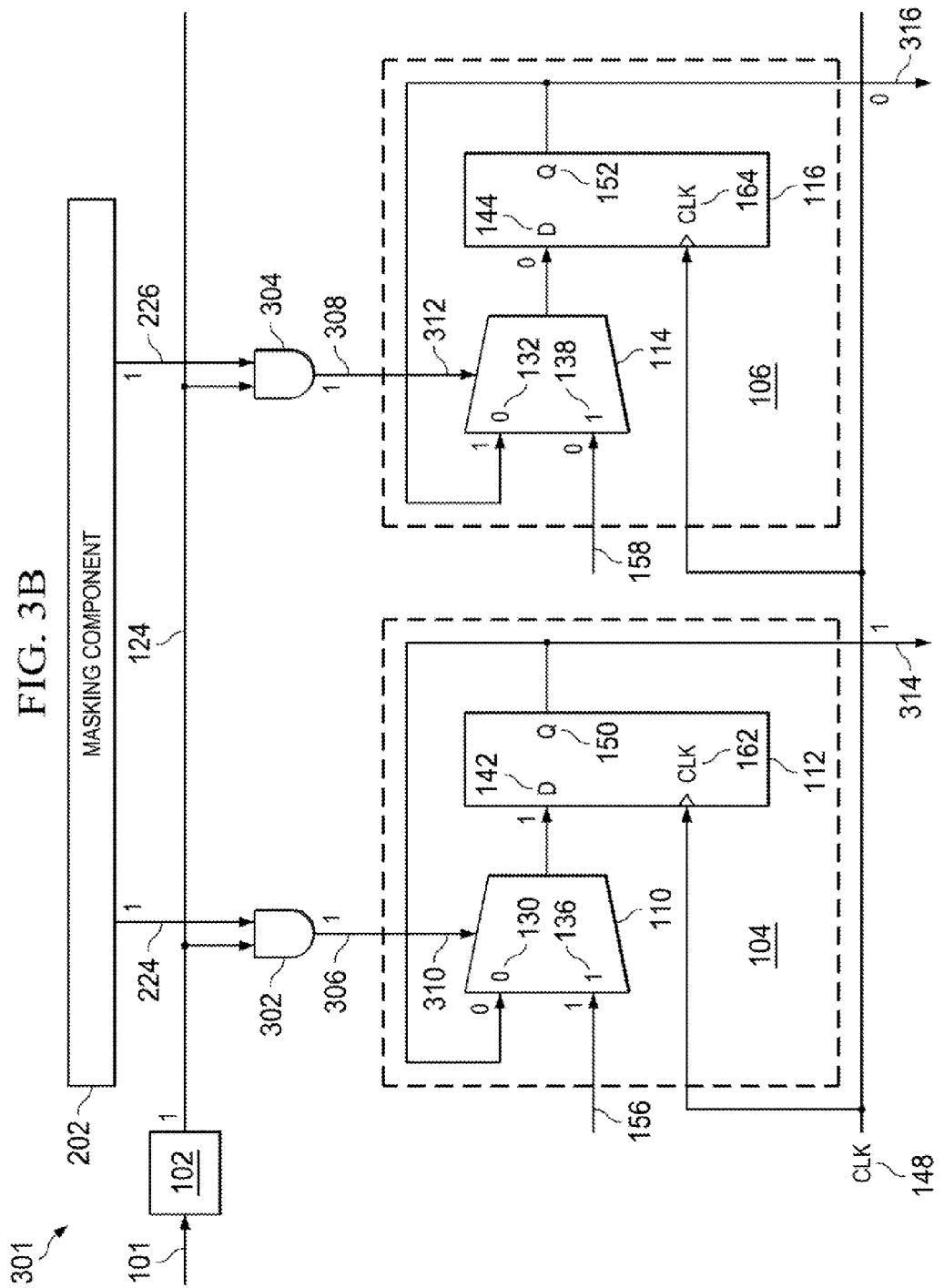
FIG. 3B further illustrates the operation of the first two bits of an example of an implementation of system.

FIG. 3B further illustrates operation of the first two bit registers of system 200 in a second state.

As shown, FIG. 3B includes address decoding logic component 102, bit register 104 and 106, and AND gate 302 and 304.

In this example, FIG. 3B shows a similar setup as FIG. 3A. However, the output of masking component 204 seen on masking lines 224 and 226 is a value of "1". This indicates that the data in bit register 104 and in bit register 106 should be modified. This value is received at AND gates 302 and 304. The address signal enters address decoding logic component 102 by way of line 101, such that address decoding logic component 102 outputs a "1". This signal passes along bus line 122 to the AND gates 302 and 304.

When both inputs are value of "1", the output 306 of AND gate 302 is "1" and the output 308 of AND gate 304 is "1." This value enters MUX 110 of bit register 104 by way of line 310 and enters MUX 114 of bit register 106 by way of line 312. The value "1" instructs MUX 110 to select input 136 as an output and instructs MUX 114 to select input 138 as an output. Now, the new data from write line 156 is passed to D-input 142 of flip-flop 112 and the new data from write line 158 is passed to D-input 138 of flip-flop 116. Since data was modified, the new value is written out by read lines 314 and 316.

By using masking signals for each bit register, as provided by masking component 204, the register writing in accordance with the present invention does not need to read the data in each register first. By removing the read step in the read-modify-write procedure of the conventional systems, the present invention reduces the time and processing power required to write into a register. Two examples of generating masking signals via a masking component in accordance with aspects of the present invention will now be described.

In the first example embodiment, the first half of the bit registers are arranged to receive masking signals from the second half of the bit registers. For example, in an 8-bit register, the first through the fourth bit registers will receive masking signals from the fifth through the eighth bit registers, respectively. Similarly, in a 16-bit register, the first through the eighth bit registers will receive masking signals from the ninth through the sixteenth bit registers, respectively. In other words, the first through the $(x/2)^{th}$ bit registers will receive masking signals form the $((x+1)/2)^{th}$ through the $x^{th}$ bit registers. This example embodiment of a masking component will now be further described with reference to FIGS. 4A-5.

Figure 4A:
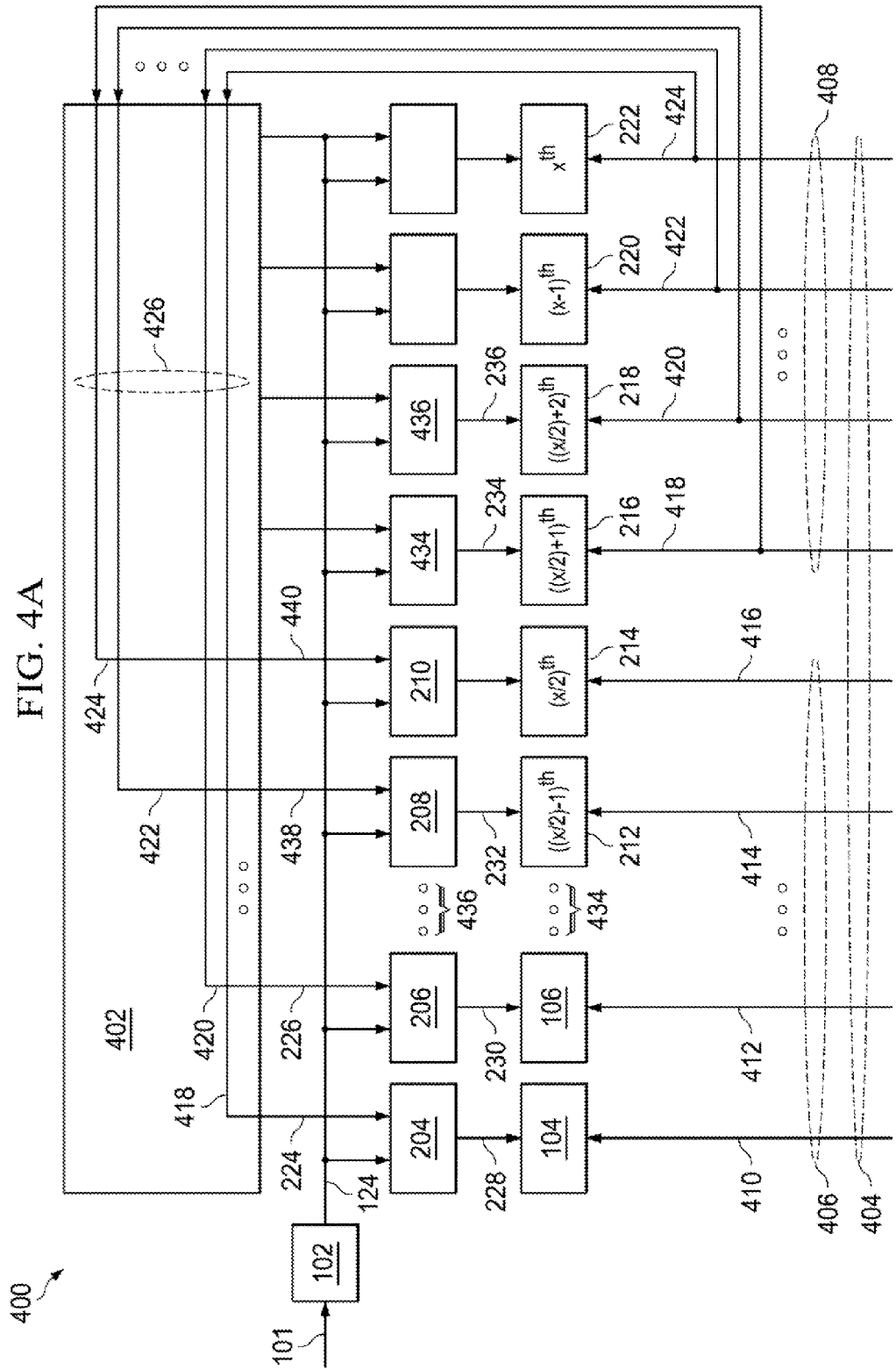
FIG. 4A illustrates an example embodiment of a write mechanism, in accordance with aspects of the present invention.

FIG. 4A illustrates an example embodiment of a write mechanism 400 in accordance with aspects of the present invention.

As shown, write mechanism 400 includes address decoding logic component 102, a masking component 402, and the functional components and the bit registers of write mechanism 200.

In this embodiment, the upper x/2 bit registers 216, 218, 220, and 222 are arranged to receive data from the corresponding functional components, a sample of which are numbered 434 and 436, by way of lines 234 and 236. Upper x/2 bit registers 216, 218, 220, and 222 are also arranged to receive data from a plurality of write lines 408, a sample of which are numbered 418, 420, 422, and 424 respectively.

The read lines (e.g., read lines 314 and 316 discussed above with reference to FIG. 3) for each of bit registers 104, 106, 212, 214, 216, 218, 220 and 222 are not shown in order to simplify the discussion. It should be noted that each bit register will have an associated read line that is able to output the value of data within the register, respectively.

Write lines 408 are additionally arranged to input data to a plurality of masking lines 426 within masking component 402, a sample of which are numbered 438, 440, 442, and 444, respectively. Masking lines 426 are connected to the lower half of the x functional components 204, 206, . . . , 208 and 210 via lines 224, 226, . . . , 438 and 440.

Write mechanism 400 uses the data within upper half of the x bit registers for masking component 402, which writes back to the lower half of the bit registers. Note that x can be any integer greater than or equal to two. Further, it should be noted that, if x were chosen to be thirty-two bits, there would be additional write lines (and read lines—not shown), bit registers, and functional components as indicated by repetitive dots within write lines 406 and 408, repetitive dots 434 between the bit registers, and repetitive dots 436 between the functional components.

For purposes of discussion, let x be eight, such that write mechanism 400 has eight bit registers. With x equal to eight, bit registers 104, 106, 212, 214, 216, 218, 220, and 222 will be the eight bit registers. In addition, the corresponding functional components, a sample of which includes 204, 206, and 208 will be eight in number.

Figure 4B:
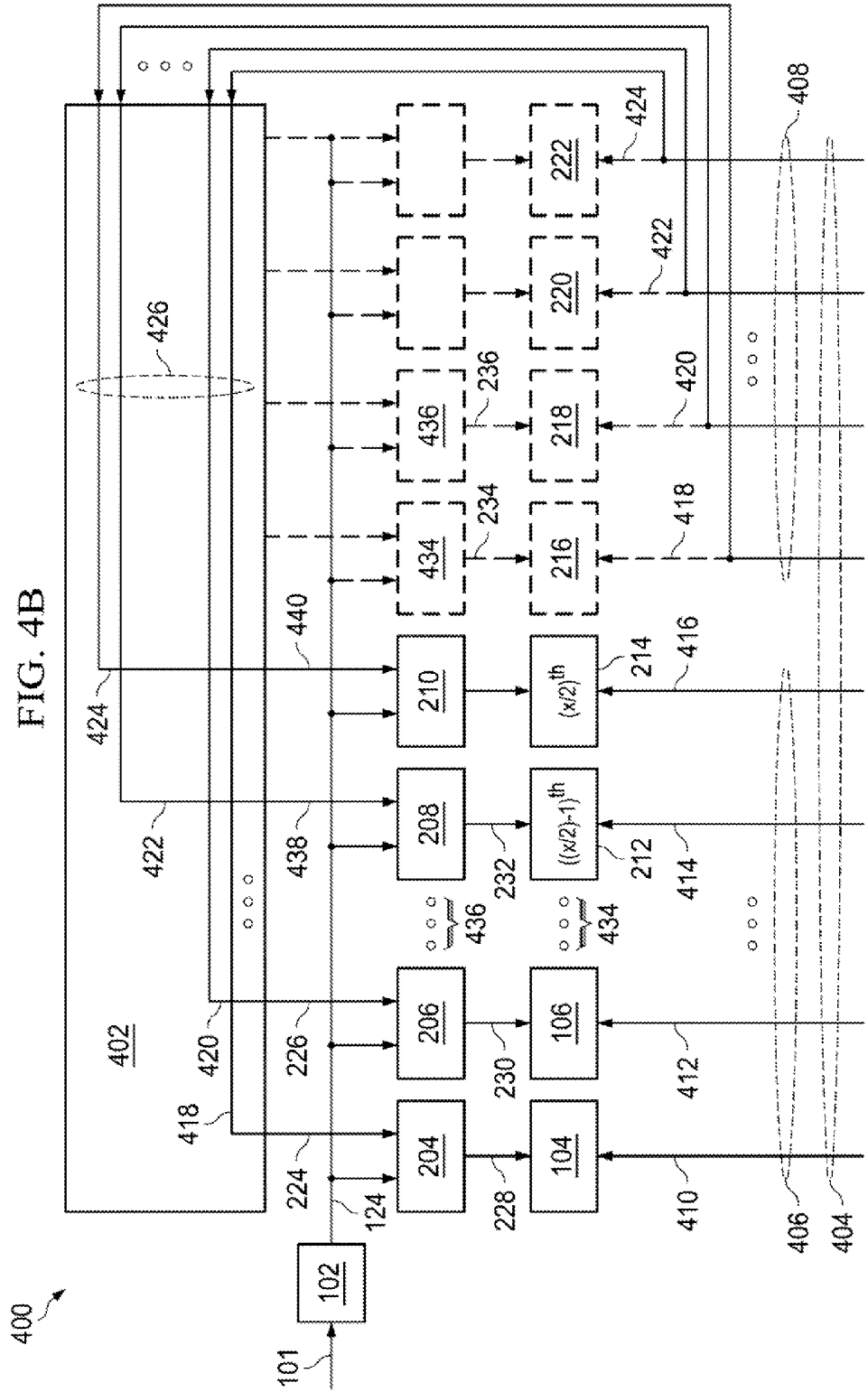
FIG. 4B illustrates another example embodiment of a write mechanism in accordance with aspects of the present invention.

In another example embodiment, the upper x/2 bit registers are not used. As shown in FIG. 4B, registers 216, 218, 220 and 220 and the corresponding functional components are removed. Further, write lines 408 no longer go to registers 216, 218, 220 and 222 (as indicated by the dotted portion of lines 418, 420, 422 and 424). This embodiment may be used to save chip real estate, when the upper x/2 bit registers are not required for use by a system. For purposes of remaining discussion, the embodiment of FIG. 4A will be used.

A method operating write mechanism 400 will now be described with reference to FIG. 5.

FIG. 5 illustrates a method 500 for writing data into the write mechanism 400 in accordance with aspects of the present invention.

As shown in the figure, method 500 starts (S502) and the bit registers have data written therein (S504). For example, returning to FIG. 4A, the sample of write lines as indicated by group of write lines 404, will write data into their corresponding bit registers. The write data provided to upper four bit registers 216, 218, 220, and 222 is additionally used as masking signals.

Next, the masking component 402 sends the masking signals by way of the masking lines 418, 420, 422 and 424 and then by way of lines 224, 226, 438 and 440, respectively, to the second input of the corresponding functional components 204, 206, 208, and 210, respectively. The enable signal coming from address decoding logic component 102 by way of line 122 is additionally provided to each of functional components 204, 206, 208, and 210. In a manner similar to that discussed above with reference to FIG. 3A-B, the output of functional components 204, 206, 208 and 210 are provided to bit registers 104, 106, 212, and 214 by way of lines 228, 230, 232, and 234, respectively.

As discussed above with reference to FIGS. 3A-B, the output of functional components 204, 206, 208 and 210 instruct the MUXs (not shown) within each of bit registers 104, 106, 212, and 214 whether or not to modify the data stored in each of bit registers 104, 106, 212, and 214.

Returning to FIG. 5, now that data has been written into the registers (S504), the data is now read from the registers (S506). For example, referring back to FIG. 4A, the new written data will be read out from registers 104, 106, and 212 by way of read lines (not shown).

Returning back to FIG. 5, now that the data has been read from the registers (S506), method 500 stops (S508).

In the example discussed above with reference to FIGS. 4-5, masking component 402 uses the upper eight bits of the write data as masking bits for the lower eight bits of the write data. With this system and method, there is no need to read, then modify, then write as was required in conventional systems and methods. On the contrary, the writing is completed in a first cycle and the reading is completed in a second cycle. This example embodiment may be implemented in systems wherein data in only half of the bit registers may need to be changed.

There may be other situations wherein data in all of the bit registers may need to be changed. An example embodiment to address such situations will now be described with reference to FIGS. 6-7.

FIG. 6 illustrates another example embodiment of a write mechanism 600 in accordance with aspects of the present invention.

As shown, FIG. 6 includes address decoding logic component 102, a masking component 602, and the functional components and the bit registers of write mechanism 200.

Masking component 602 is arranged to receive a mask register write signal from a write line 604.

Write mechanism 600 is the second implementation using a masking component to write only the required bits. In this example write mechanism 600 includes x bit registers, wherein x can be any integer. If x were 32, e.g., making a thirty-two bit register, there would be additional write lines (and read lines—not shown), bit registers, and functional components as indicated by the repetitive dots within write lines 406 and 408, bit registers 434, and functional components 436.

For purposes of discussion, let x be eight, such that write mechanism 400 has eight bit registers. With x equal to eight, bit registers 104, 106, 212, 214, 216, 218, 220, and 222 will be the eight bit registers. In addition, the corresponding functional components, a sample of which includes 204, 206, and 208 will be eight in number.

A method operating write mechanism 600 will now be described with reference to FIG. 7.

FIG. 7 illustrates a method 700 for writing data into the write mechanism 400 in accordance with aspects of the present invention.

As shown in the figure, method 700 starts (S702) and the mask register write signal is written into the mask register (S704). For example, in one cycle, masking component 602 receives a mask register write signal from write line 604.

Referring back to FIG. 7, now that writing to mask register is complete (S704), the bit registers have data written therein (S706). For example, returning to FIG. 6, write lines 410, 412, 414, 416, 418, 420, 422 and 424 will write data into bit registers, 104, 106, 212, 214, 216, 218, 220 and 222, respectively.

Further, masking component 602 outputs masking signals to the functional components, of which a sample are numbered 204, 206, and 208, by way of lines 224, 226, 438 and 440. In an example embodiment, the masking signals correspond to the bits of the mask register write signal. For example, in an 8-bit system, the mask register write signal is an 8-bit binary word, wherein each bit in the 8-bit binary word will be a masking signal for a respective functional component. The masking signal sent from the masking component and the enable signal from address decoding logic component 102 will then be the inputs for each of the functional components, including those labeled as functional components 204, 206, 208 and 210.

In a manner similar to that discussed above with reference to FIGS. 3A-B, the output of functional components 204, 206, 208 and 210 are provided to bit registers 104, 106, 212, and 214 by way of lines 228, 230, 232, and 234, respectively.

Returning to FIG. 7, now that data has been written to the registers (S706), the data is read from the registers (S708). For example, returning to FIG. 6, the output of a functional component would instruct the MUX within a corresponding bit register as to whether the data stored within the bit register needs to be modified. If there is no modification, the value was masked, and the existing data within the bit register would be recycled and be read out by way of a read line (not shown). If there is a modification, the new data would be written into the bit register and then read out by way of the read line (not shown). This process also takes one cycle, for a total of two complete cycles Returning back to FIG. 7, now that the data has been read from the registers (S708), method 700 stops (S710).

In the example discussed above with reference to FIGS. 6-7, masking component 602 is provided with a mask register write signal to generate masking signals for all bit registers. With this system and method, again there is no need to read, then modify, then write as was required in conventional systems and methods. On the contrary, the mask signal writing and the register writing are both completed in a first cycle and the reading of the registers is completed in a second cycle. This example embodiment may be implemented in systems wherein data in all of the bit registers may need to be changed.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device comprising:
    an address decoding logic component operable to output an enable signal based on an address signal;
    x bit registers including a first portion and a second portion, each of said x bit registers being operable to store one of x stored bits of data, respectively, said first portion having $0^{th}$ through $(x/2-1)^{th}$ bit registers, said second portion having $(x/2)^{th}$ through $(x-1)^{th}$ bit registers;
    x/2 write lines, each of which is operable to provide one of x/2 new bits of data into a corresponding one of said bit registers in said first portion, respectively;
    x/2 read lines, each of which is operable to output one of the stored bits of data from a corresponding one of said bit registers in said first portion, respectively;
    x/2 functional components, each of which is operable to provide a modified enable signal to a corresponding one of said bit registers in said first portion, respectively; and
    a masking component operable to generate x/2 masking signals and to provide one of the x/2 masking signals to a corresponding one of said functional components, respectively,
    wherein each modified enable signal is based on the enable signal and a corresponding masking signal,
    wherein each of said bit registers in said first portion is operable to modify a stored bit therein, respectively, based on the corresponding modified enable signal, respectively, and
    wherein x is an integer greater than or equal to 2.

2. The device of claim 1, wherein each functional component comprises an AND gate arranged to receive one of the x/2 masking signals and the enable signal and is operable to output a Boolean AND of the received one of the x/2 masking signals and the enable signal.

3. The device of claim 2, further comprising:
    x/2 additional write lines, each of which is operable to provide one of x/2 additional new bits of data into a corresponding one of said bit registers in said second portion, respectively,
    wherein said masking component comprises x/2 masking lines, each of which is connected to one of said x/2 additional write lines, and each of which is operable to provide a corresponding additional new bit of data to one of said functional components, respectively.

4. The device of claim 2, wherein said masking component comprises a mask register arranged to receive a mask register write signal in a first clock cycle, said mask register including x/2 masking lines, each of which is operable to provide a corresponding bit of data to one of said functional components, respectively, based on the mask register write signal in a second clock cycle.

5. The device of claim 4, further comprising:
x/2 additional write lines, each of which is operable to provide one of x/2 additional new bits of data into a corresponding one of said bit registers in said second portion, respectively;
x/2 additional read lines, each of which is operable to output one of said stored bits of data from a corresponding one of said bit registers in said second portion, respectively; and
x/2 additional functional components, each of which is operable to provide an additional modified enable signal to a corresponding one of said bit registers in said second portion, respectively,
wherein said masking component is further operable to generate x/2 additional masking signals and to provide one of the x/2 additional masking signals to a corresponding one said additional functional components, respectively;
wherein each modified enable signal is based on the enable signal and a corresponding additional masking signal,
wherein each of said bit registers in said second portion is operable to modify a stored bit therein, respectively, based on the corresponding additional modified enable signal, respectively.

6. The device of claim 2, further comprising:
x/2 additional write lines, each of which is operable to provide one of x/2 additional new bits of data into a corresponding one of said bit registers in said second portion, respectively,
wherein said masking component comprises x/2 masking lines, each of which is connected to one of said x/2 additional write lines, and each of which is operable to provide a corresponding additional new bit of data to one of said functional components, respectively.

7. The device of claim 1, wherein said masking component comprises mask register arranged to receive a mask register write signal in a first clock cycle, said mask register including x/2 masking lines, each of which is operable to provide a corresponding bit of data to one of said functional components, respectively, based on the mask register write signal in a second clock cycle.

8. The device of claim 7, further comprising:
x/2 additional write lines, each of which is operable to provide one of x/2 additional new bits of data into a corresponding one of said bit registers in said second portion, respectively;
x additional read lines, each of which is operable to output one of said stored bits of data from a corresponding one of said bit registers in said second portion, respectively; and
x/2 additional functional components, each of which is operable to provide an additional modified enable signal to a corresponding one of said bit registers in said second portion, respectively,
wherein said masking component is further operable to generate x/2 additional masking signals and to provide one of the x/2 additional masking signals to a corresponding one said additional functional components, respectively;
wherein each modified enable signal is based on the enable signal and a corresponding additional masking signal,
wherein each of said bit registers in said second portion is operable to modify a stored bit therein, respectively, based on the corresponding additional modified enable signal, respectively.

9. The device of claim 1, further comprising:
x/2 additional write lines, each of which is operable to provide one of x/2 additional new bits of data into a corresponding one of said bit registers in said second portion, respectively,
wherein said masking component comprises x/2 masking lines, each of which is connected to one of said x/2 additional write lines, and each of which is operable to provide a corresponding additional new bit of data to one of said functional components, respectively.

10. The device of claim 9, wherein said a masking component comprises mask register arranged to receive a mask register write signal in a first clock cycle, said mask register including x/2 masking lines, each of which is operable to provide a corresponding bit of data to one of said functional components, respectively, based on the mask register write signal in a second clock cycle.

11. A method comprising:
outputting, via an address decoding logic component, an enable signal based on an address signal;
storing, via x bit registers including a first portion and a second portion, one of x stored bits of data, respectively, the first portion having $0^{th}$ through $(x/2-1)^{th}$ bit registers, the second portion having $(x/2)^{th}$ through $(x-1)^{th}$ bit registers;
providing, via x/2 write lines, one of x/2 new bits of data into a corresponding one of the bit registers in the first portion, respectively;
outputting, via x read lines, one of the stored bits of data from a corresponding one of the bit registers in the first portion, respectively;
providing, via x/2 functional components, a modified enable signal to a corresponding one of the bit registers in the first portion, respectively;
generating, via a masking component, x/2 masking signals;
providing, via the masking component, one of the x/2 masking signals to a corresponding one of the functional components, respectively; and
modifying, via each of the bit registers in said first portion, a stored bit therein, respectively, based on the corresponding modified enable signal, respectively,
wherein each modified enable signal is based on the enable signal and a corresponding masking signal.

12. The method of claim 11, wherein said providing, via x/2 functional components, a modified enable signal to a corresponding one of the bit registers in the first portion, respectively, comprises providing, the modified enable signal, via x/2 AND gates, each of which is arranged to receive one of the x/2 masking signals and the enable signal and is operable to output a Boolean AND of the received one of the x/2 masking signals and the enable signal.

13. The method of claim 12, further comprising:
providing, via x/2 additional write lines, one of x/2 additional new bits of data into a corresponding one of the bit registers in the second portion, respectively,
wherein said generating, via a masking component, x/2 masking signals comprises providing, via x/2 masking lines, each of which is connected to one of the x/2 additional write lines, a corresponding additional new bit of data to one of said functional components, respectively.

14. The method of claim 12, wherein said generating, via a masking component, x/2 masking signals comprises generating, via a mask register arranged to receive a mask register write signal in a first clock cycle, the mask register including x/2 masking lines, each of which is operable to provide a corresponding bit of data to one of the functional components, respectively, based on the mask register write signal in a second clock cycle.

15. The method of claim 14, further comprising:
providing, via x/2 additional write lines, one of x/2 additional new bits of data into a corresponding one of the bit registers in the second portion, respectively;
outputting, via x additional read lines, one of the stored bits of data from a corresponding one of the bit registers in the second portion, respectively;
providing, via x/2 additional functional components, an additional modified enable signal to a corresponding one of the bit registers in said second portion, respectively;
generating, via the masking component, x/2 additional masking signals;
providing, via the masking component, one of the x/2 additional masking signals to a corresponding one the additional functional components, respectively; and
modifying, via each of the bit registers in the second portion, a stored bit therein, respectively, based on the corresponding additional modified enable signal, respectively,
wherein each modified enable signal is based on the enable signal and a corresponding additional masking signal.

16. The method of claim 12, further comprising:
providing, via x/2 additional write lines, one of x/2 additional new bits of data into a corresponding one of the bit registers in the second portion, respectively,
wherein said generating, via a masking component, x/2 masking signals comprises providing, via x/2 masking lines, each of which is connected to one of the x/2 additional write lines, a corresponding additional new bit of data to one of said functional components, respectively.

17. The method of claim 11, wherein said generating, via a masking component, x/2 masking signals comprises generating, via a mask register arranged to receive a mask register write signal in a first clock cycle, the mask register including x/2 masking lines, each of which is operable to provide a corresponding bit of data to one of the functional components, respectively, based on the mask register write signal in a second clock cycle.

18. The method of claim 17, further comprising:
providing, via x/2 additional write lines, one of x/2 additional new bits of data into a corresponding one of the bit registers in the second portion, respectively;
outputting, via x additional read lines, one of the stored bits of data from a corresponding one of the bit registers in the second portion, respectively;
providing, via x/2 additional functional components, an additional modified enable signal to a corresponding one of the bit registers in said second portion, respectively;
generating, via the masking component, x/2 additional masking signals;
providing, via the masking component, one of the x/2 additional masking signals to a corresponding one the additional functional components, respectively; and
modifying, via each of the bit registers in the second portion, a stored bit therein, respectively, based on the corresponding additional modified enable signal, respectively,
wherein each modified enable signal is based on the enable signal and a corresponding additional masking signal.

19. The method of claim 11, further comprising:
providing, via x/2 additional write lines, one of x/2 additional new bits of data into a corresponding one of the bit registers in the second portion, respectively,
wherein said generating, via a masking component, x/2 masking signals comprises providing, via x/2 masking lines, each of which is connected to one of the x/2 additional write lines, a corresponding additional new bit of data to one of said functional components, respectively.

20. The method of claim 19, wherein said generating, via a masking component, x/2 masking signals comprises generating, via a mask register arranged to receive a mask register write signal in a first clock cycle, the mask register including x/2 masking lines, each of which is operable to provide a corresponding bit of data to one of the functional components, respectively, based on the mask register write signal in a second clock cycle.

* * * * *